US012320864B2

(12) United States Patent
Larkin et al.

(10) Patent No.: US 12,320,864 B2
(45) Date of Patent: Jun. 3, 2025

(54) MULTIPARAMETER NONINVASIVE ARCHING DISCHARGE ANOMALY MONITORING DEVICE AND METHOD

(71) Applicant: Eaton Intelligent Power Limited, Dublin (IE)

(72) Inventors: Maebh Larkin, Dublin (IE); Keith Nolan, Dublin (IE); Wyndham Fairchild Gary, Jr., Saint Joseph, MI (US); Antonino Vespoli, Dublin (IE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 210 days.

(21) Appl. No.: 17/852,517

(22) Filed: Jun. 29, 2022

(65) Prior Publication Data

US 2022/0413064 A1     Dec. 29, 2022

Related U.S. Application Data

(60) Provisional application No. 63/216,353, filed on Jun. 29, 2021.

(51) Int. Cl.
    *G01R 31/28* (2006.01)
    *G01R 31/56* (2020.01)
(52) U.S. Cl.
    CPC ......... *G01R 31/56* (2020.01); *G01R 31/2837* (2013.01)
(58) Field of Classification Search
    CPC ........ G01R 31/12; G01R 31/14; G01R 31/56; G01R 31/1227; G01R 31/1272; G01R 31/2837; G05B 23/0283
    See application file for complete search history.

(56) References Cited

U.S. PATENT DOCUMENTS

| | | | |
|---|---|---|---|
| 2010/0123464 A1* | 5/2010 | Park | G01R 31/1227 324/500 |
| 2014/0055886 A1* | 2/2014 | Spangenberg | H02H 7/222 361/2 |

(Continued)

FOREIGN PATENT DOCUMENTS

| KR | 101812118 B1 | 1/2018 |
|---|---|---|
| KR | 101823010 B1 | 1/2018 |
| KR | 102079813 B1 | 2/2020 |

OTHER PUBLICATIONS

International Search Report and Written Opinion issued in International Application No. PCT/EP2022/025297, mailed Oct. 24, 2022, 10 pages.

*Primary Examiner* — Thang X Le
(74) *Attorney, Agent, or Firm* — Talem IP Law, LLP

(57) ABSTRACT

A monitoring device is disclosed that is configured to monitor conditions within an electrical enclosure containing electrical equipment. The monitoring device comprises a support configured to couple to an interior surface of the electrical enclosure. The support is configured to hold and electrically couple a plurality of sensors, at least two RF antennas, at least one processor in communication with the plurality of sensors and the at least two RF antennas, and a power connection configured to receive electrical and Ethernet input. The at least one processor is configured to receive and analyze data obtained from the plurality of sensors and the at least two RF antennas pertaining to a plurality of conditions inside the electrical enclosure. The at least one processor is configured to detect a potential electrical equipment failure based on the received an analyzed data.

18 Claims, 7 Drawing Sheets

(56) References Cited

U.S. PATENT DOCUMENTS

| | | | |
|---|---|---|---|
| 2015/0103862 A1* | 4/2015 | Wei | G01J 5/026 |
| | | | 374/121 |
| 2015/0260778 A1 | 9/2015 | Park et al. | |
| 2016/0100091 A1* | 4/2016 | Curiel Montoya | G01R 31/00 |
| | | | 348/82 |
| 2016/0187449 A1 | 6/2016 | Beiner et al. | |
| 2017/0122802 A1* | 5/2017 | Brown | E06B 9/24 |
| 2017/0227596 A1* | 8/2017 | Sozer | E04H 12/00 |
| 2020/0182684 A1* | 6/2020 | Yoskovitz | G01R 33/02 |
| 2020/0366079 A1 | 11/2020 | Telefus et al. | |
| 2021/0088573 A1* | 3/2021 | Ferraro | G01N 33/0031 |
| 2021/0123966 A1* | 4/2021 | Karin | G01R 31/62 |
| 2021/0203150 A1* | 7/2021 | Shea | H02H 3/063 |

* cited by examiner

MULTIPARAMETER NONINVASIVE ARCHING DISCHARGE ANOMALY MONITORING DEVICE AND METHOD

CROSS-REFERENCE TO RELATED APPLICATION

This application claims the benefit of Provisional Application Ser. No. 63/216,353, filed Jun. 29, 2021.

BACKGROUND

Electrical enclosures are used to house electrical equipment and connections that may play a crucial part in an electrical generation, transmission, and distribution system. Such enclosures may be distributed throughout an installation and are generally unmanned. Over time, corrosion of the electrical connections within the enclosures can occur, which leads to a serious electrical failure. Since a centralized network is not always installed or available, some of these unattended enclosures are not monitored for component failure. This leads to unplanned and electrical failures that can be costly to repair and can result in damage to other components along an electrical chain. Other enclosures are capable of remote monitoring of one or more parameters using one or more sensor systems. However, many of these monitoring systems are invasive systems in that they require a direct connection to the component being monitored. This increases the cost of installation and makes it impossible to detect an electrical anomaly in another component without including an additional sensor system.

Monitoring for multiple parameters, such as sound, photo emissions, and ozone levels within an electrical enclosure increases the ability to effectively predict costly electrical failures before they occur. However, monitoring multiple parameters requires the purchase and installation of multiple types of sensor systems that are individually mounted within the enclosure. A communication link is then established between each individual sensor in the system and a Supervisory Control and Data Acquisition (SCADA) system via Modbus or an Ethernet connection. Unfortunately, the purchase and installation of multiple individual sensors and corresponding communication links is prohibitively expensive. As a result, many enclosures are monitored for only a single parameter or are not monitored at all, which leads to costly repairs of failed electrical equipment or unnecessary maintenance on functioning electrical equipment.

These are just some of shortcomings that exist with current devices and methods used to monitor arching discharge anomalies in electrical enclosures.

BRIEF SUMMARY

The present disclosure relates to a device configured to non-invasively monitor arching discharge anomalies in electrical enclosures. In an embodiment, the device is a single board computer with multiple sensors configured to detect partial discharge, track arching frequency and intensity in order to predict failure, which may be used to schedule and track maintenance in order to prevent an expensive unplanned electrical failure.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

A more particular description of the invention briefly summarized above may be had by reference to the embodiments, some of which are illustrated in the accompanying drawings. It is to be noted, however, that the appended drawings illustrate only typical embodiments of this invention and are therefore not to be considered limiting of its scope, for the invention may admit to other equally effective embodiments. Thus, for further understanding of the nature and objects of the invention, references can be made to the following detailed description, read in connection with the drawings in which.

DETAILED DESCRIPTION

The following description relates to various embodiments of a method and device for non-invasively monitor arching discharge anomalies in electrical substations.

It will be readily apparent that these embodiments are merely examples, and that numerous variations and modifications are possible that embody the inventive aspects discussed herein. Several terms are used throughout this description to describe the salient features of the invention in conjunction with the accompanying figures. These terms, which may include "first", "second", "inner", "outer", and the like are not intended to overly limit the scope of the invention, unless so specifically indicated. The terms "about" or "approximately" as used herein may refer to a range of 80%-125% of the claimed or disclosed value. With regard to the drawings, their purpose is to depict salient features of the method and device for non-invasively monitor arching discharge anomalies in electrical enclosures and are not specifically provided to scale.

Figure 1:
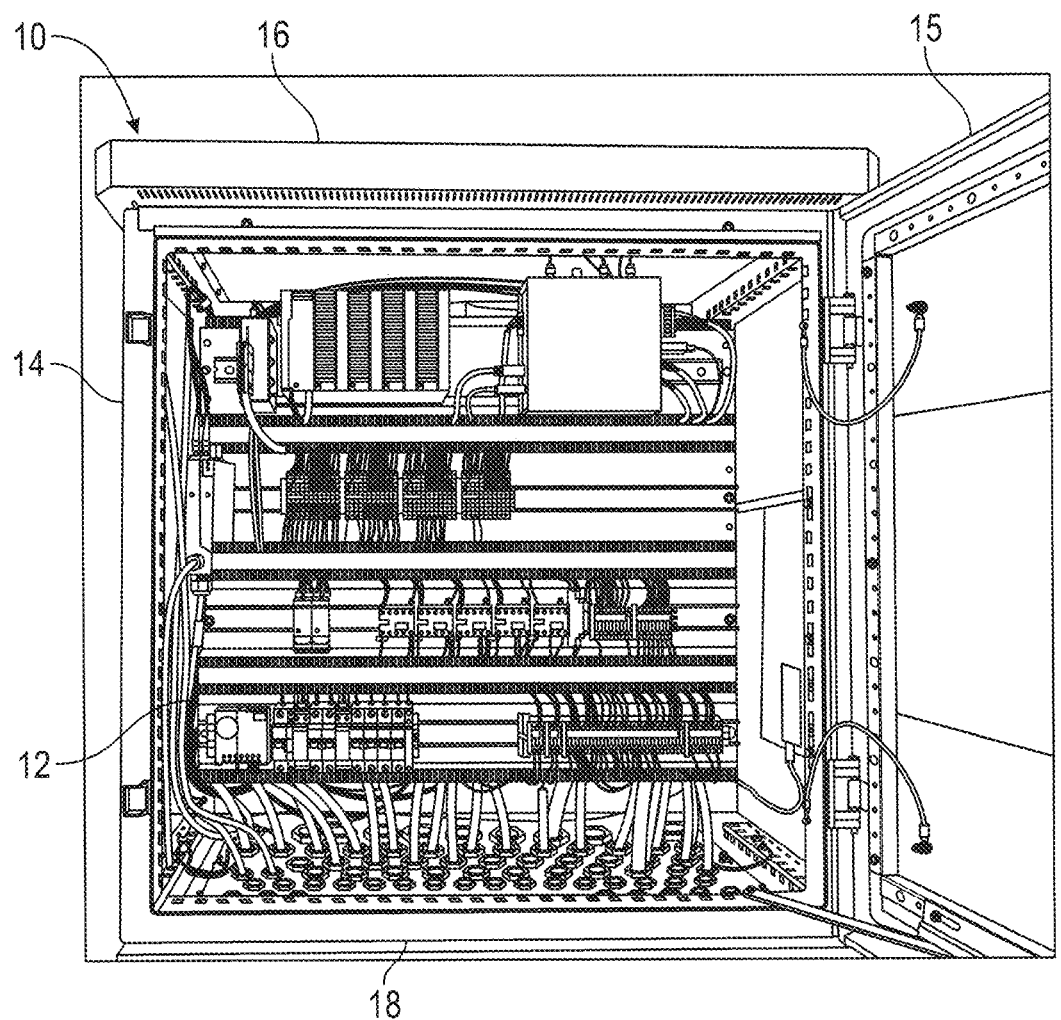
FIG. 1 is a photograph of a front view of an electrical enclosure housing a variety of electrical components and/or connections.
Figure 2:
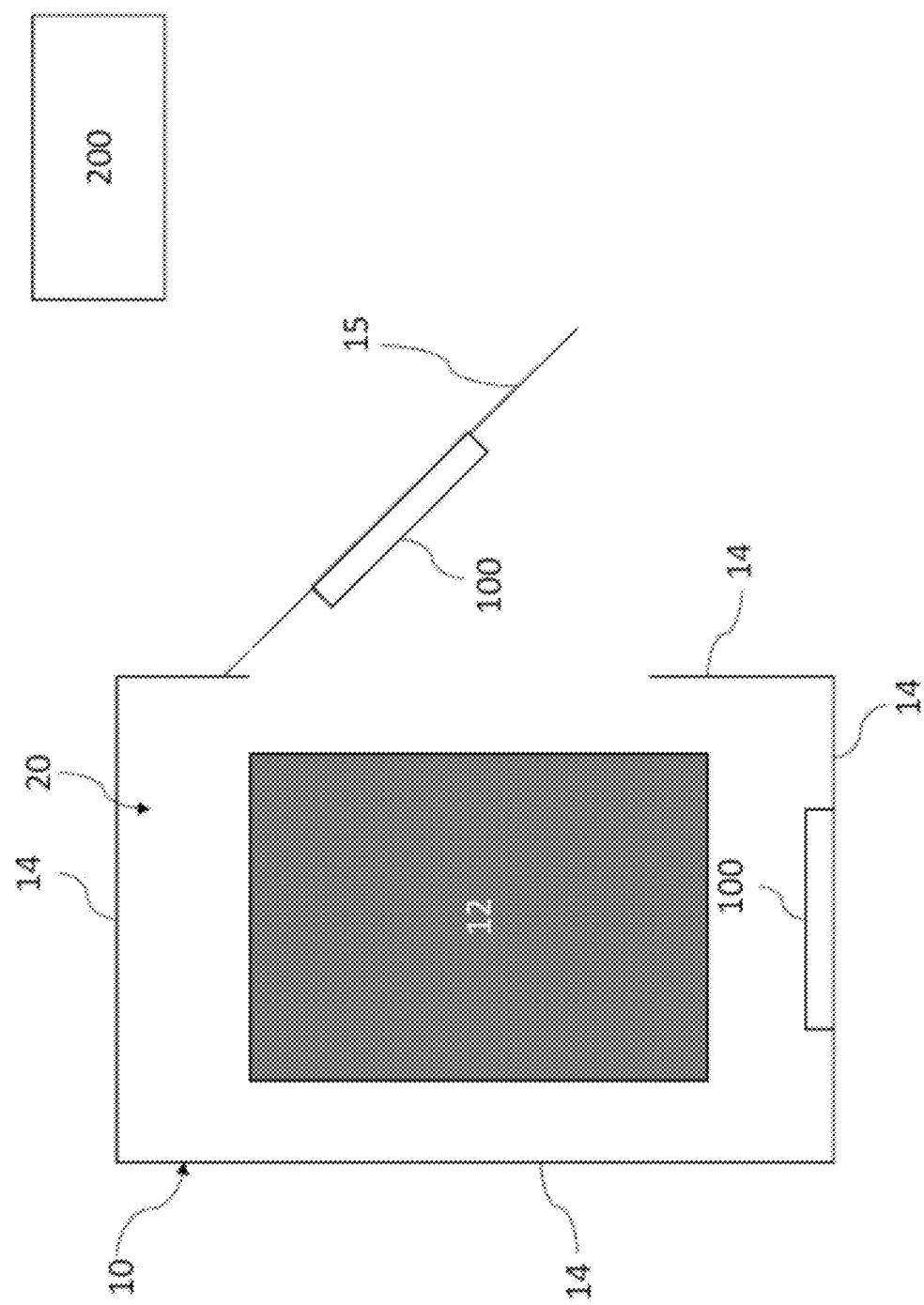
FIG. 2 illustrates a schematic depiction of an embodiment of the electrical enclosure housing a plurality of electrical components and/or connections of FIG. 1 along with an embodiment of the inventive monitoring device.

FIG. 1 is a photograph of a front view of an electrical enclosure housing a variety of electrical components and/or connections; FIG. 2 illustrates a schematic depiction of an embodiment of the electrical enclosure housing a plurality of electrical components and/or connections of FIG. 1 along with an embodiment of the inventive monitoring device.

FIG. 1 is a depiction of an example of an enclosure 10 containing various pieces of electrical equipment 12 and various electrical connections. One skilled in the art would realize that the shape, size, and contents of an enclosure 10 will depend on its location and intended use. As shown, one or more of the electrical components may be mounted on racks, which are in turn mounted to a portion of the enclosure 10.

Referring to FIG. 1 and FIG. 2, the enclosure 10 may generally comprise a plurality of sides 14, a top 16, and a bottom 18. At least one of the sides 14 includes an access portal 15 or door that enables access to the interior 20 of the enclosure 10 and also enables the interior 20 of the enclosure to be closed off from the environmental conditions outside the enclosure 10.

Referring to FIG. 2, a system for non-invasively monitoring arching discharge anomalies generally comprises a monitoring device 100 in communication with a remote monitoring station 200. Monitoring device 100 is configured to be mounted on an interior or a side 14 or an interior surface of the access portal 15.

The monitoring device 100 is configured to continuously obtain data pertaining to multiple parameters or conditions within the enclosure 10 and analyze the data to determine whether a failure is likely to occur. The collected and analyzed data provided from the monitoring device 100 enables a future failure to be predicted in order to schedule maintenance to repair or replace electrical equipment 12 prior to an equipment failure. The monitoring device 100 may also be configured to sense, track, and/or automatically schedule maintenance to be performed on electrical equipment 12 within the enclosure 10.

The monitoring device 100 is generally described herein with preferred embodiments provided by way of example. One skilled in the art would realize that the fit, form, and/or function of one or more components of the monitoring device 100 may deviate from a preferred embodiment while still performing the desired monitoring functions described herein.

A monitoring system may comprise a plurality of monitoring devices 100 in communication with one or more remote controllers or processors. The non-invasive nature of the monitoring devices 100 enables them to be easily installed. Multiple monitoring devices 100 may be positioned in a single enclosure 10 in order to detect anomalies on a rack-by-rack basis. One or more processors may be part of the monitoring device 100 and/or may be part of a remote-control unit. A support (e.g., 310 shown in FIG. 3A) of the monitoring device 100 may further be positioned or fixed within a housing (not shown). The housing (not shown) may at least partially surround the components coupled to the support and may define one or more openings to enable exposure of one or more of the electrical components to the ambient environment of the enclosure 10 for the purposes of monitoring parameters such as, but not limited to, sound, light, ozone, temperature, moisture, and electromagnetic interference.

Figure 3A:
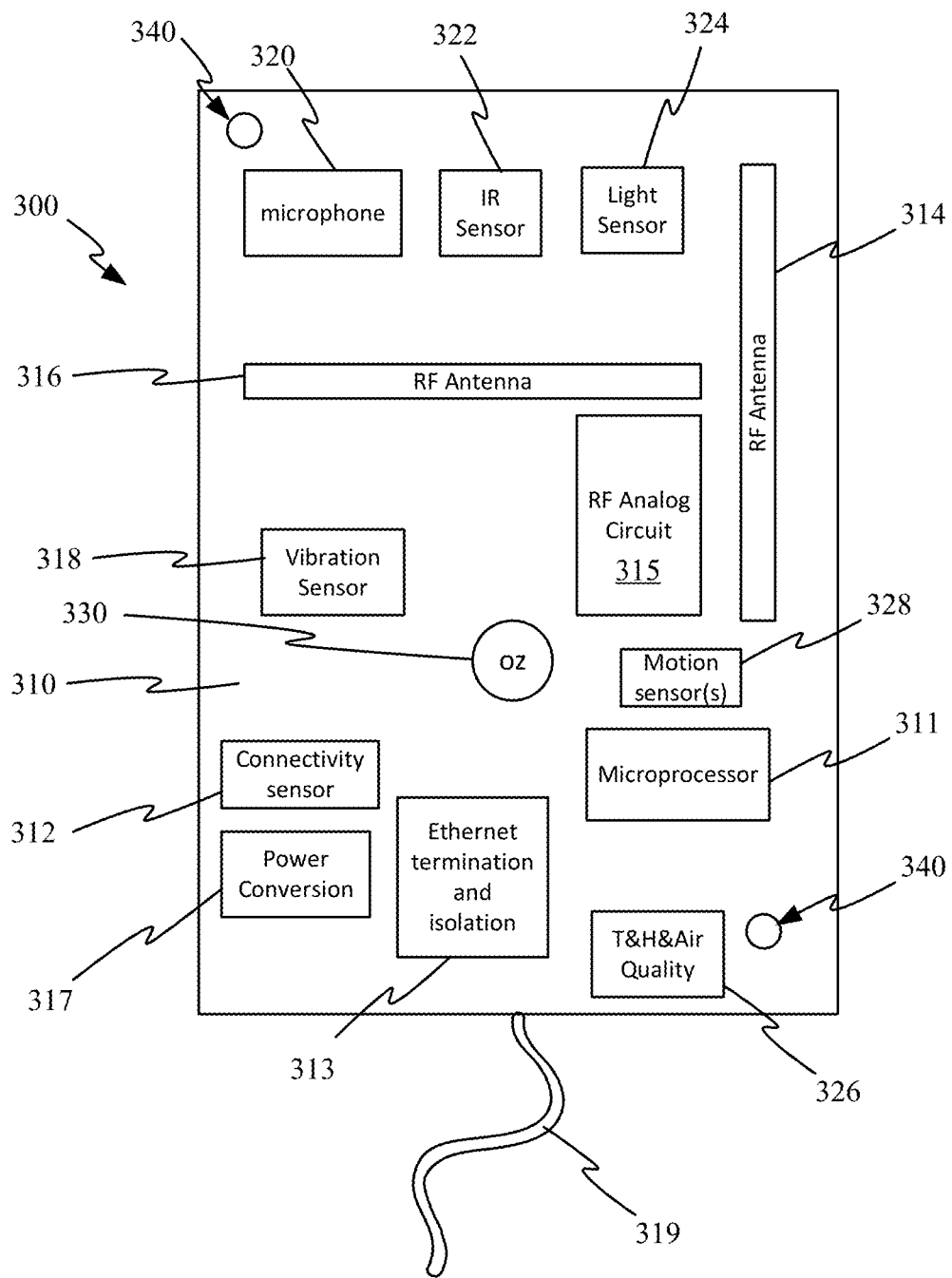
FIG. 3A illustrates a schematic depiction of an embodiment of the inventive monitoring device.
Figure 3B:
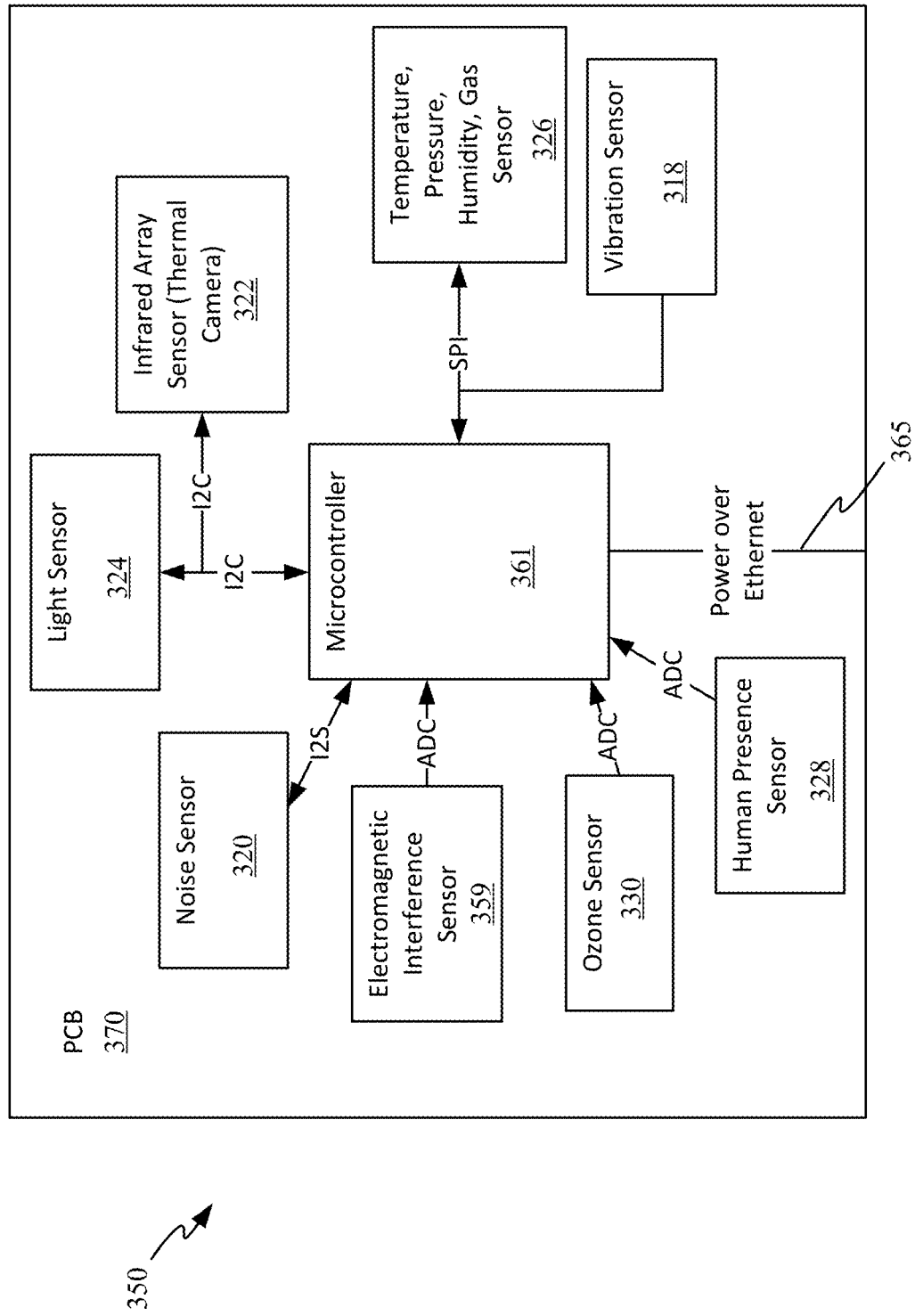
FIG. 3B illustrates a schematic depiction of an embodiment of the inventive monitoring device.

FIGS. 3A and 3B illustrate schematic depiction of two embodiments of the inventive monitoring device. Referring to FIG. 3A, in one example embodiment, monitoring device 100 is implemented as monitoring device 300. Monitoring device 300 includes a plurality of sensors, at least two RF antennas (e.g., RF antenna 314 and RF antenna 316), at least one processor (e.g., microprocessor 311) in communication with the plurality of sensors and the at least two RF antennas, a power connection 319 configured to receive electrical and Ethernet input (e.g., in the form of Power over Ethernet or in the form of Ethernet over Power, also referred to as Powerline), and a support 310 configured to couple to an interior surface of the electrical enclosure (e.g., enclosure 10). The monitoring device 300 can further include a housing configured to at least partially surround the support 310 and define one or more openings. That is, a housing (not shown) at least partially surrounds the support 310 and any components coupled to the support 310.

The support 310 is configured to hold and electrically couple the plurality of sensors, the at least two RF antennas, the at least one processor, and the power connection. Support 310 is configured to be mounted to a rack, rail, or other surface inside an electrical enclosure (e.g., enclosure 10). In an embodiment, one or more mount openings 340 are defined on the support 310 and are configured to enable mechanical fastening of the support 310 to the enclosure 10. In an embodiment, the support 310 is an electrical board or circuit board configured to electrically couple components that are coupled to the board 310.

Figure 5:
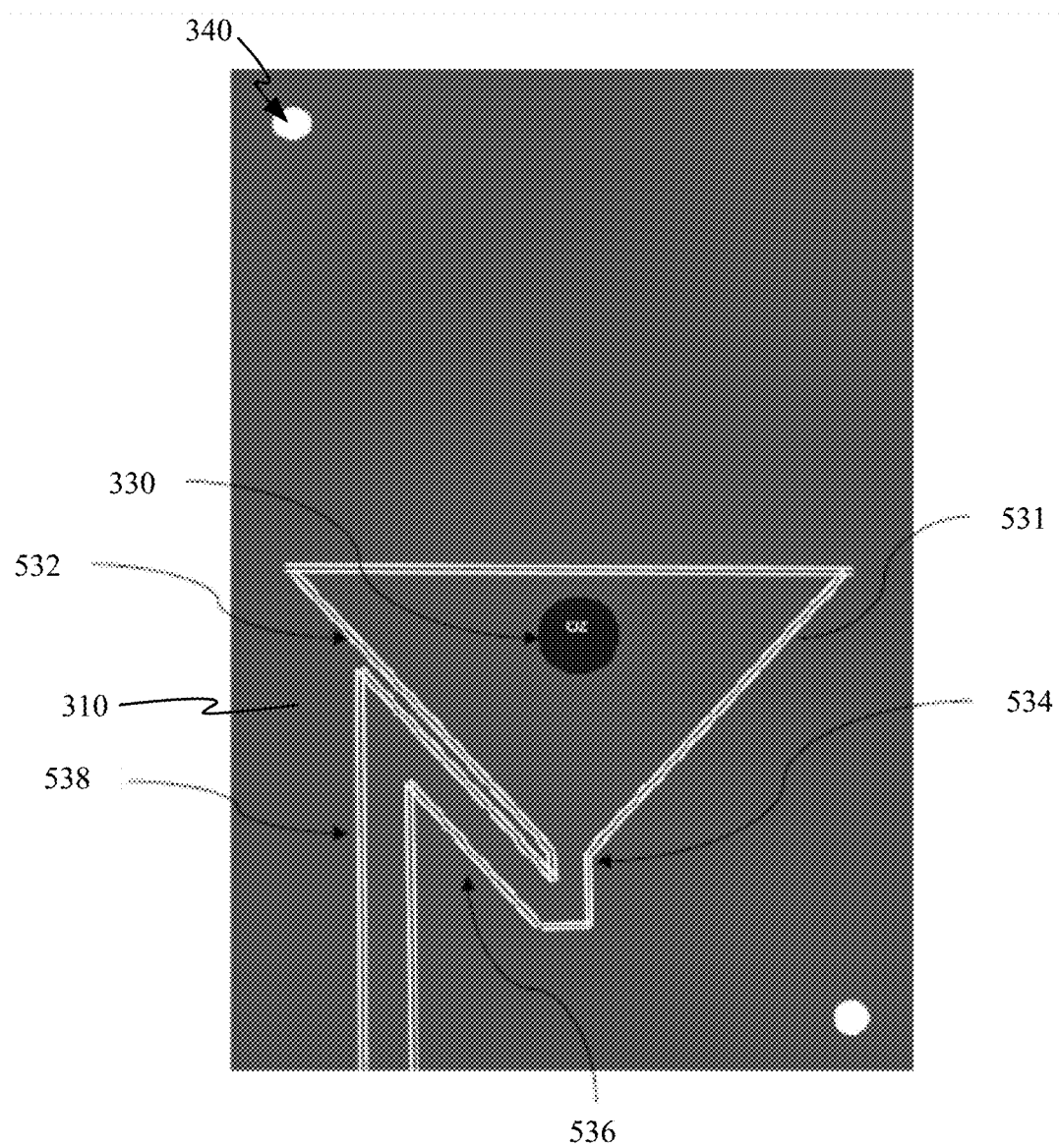
FIG. 5 illustrates a schematic layout for an ozone sensor for an embodiment of the inventive monitoring device.

The one or more sensors can include a vibration sensor 318, a noise sensor and/or microphone 320, an infrared (IR) sensor 322, a photo or light sensor 324, a climate sensor 326 (e.g., configured to measure temperature, humidity, and air quality), one or more motion sensors 328, and an ozone sensor 330. The one or more motion sensors 328 can be configured to detect motion of the electrical equipment inside the enclosure 10 as well as motion associated with human access to the enclosure 10. When human access is detected, the monitoring system may be configured to receive input regarding who accessed the enclosure 10 and what actions were performed. For example, a range of tamper/access detection techniques can be incorporated including motion detection, button actuation, vibration, and g-force, etc. Actions e.g., events detected by sensors and physical interactions with buttons can be recorded on board and analyzed by the processor and/or offloaded to a remote location. FIG. 5 illustrates an embodiment of the ozone sensor 330.

Each of the sensors 318, 320, 322, 324, 326, 330 (and any other sensors provided in different embodiments) may obtain data pertaining to various parameters within the enclosure 10 and provide said data to the processor 311. FIG. 3B illustrates an example implementation of connections between various sensors and a processor (which may be used by monitoring device 300 of FIG. 3A).

Processor 311 may compare data to corresponding pre-programmed background or threshold levels of vibration, sound, IR, light, climate variables, and ozone, respectively, to determine whether a potential problem exists with equipment 12 within the enclosure 10.

Figure 4:
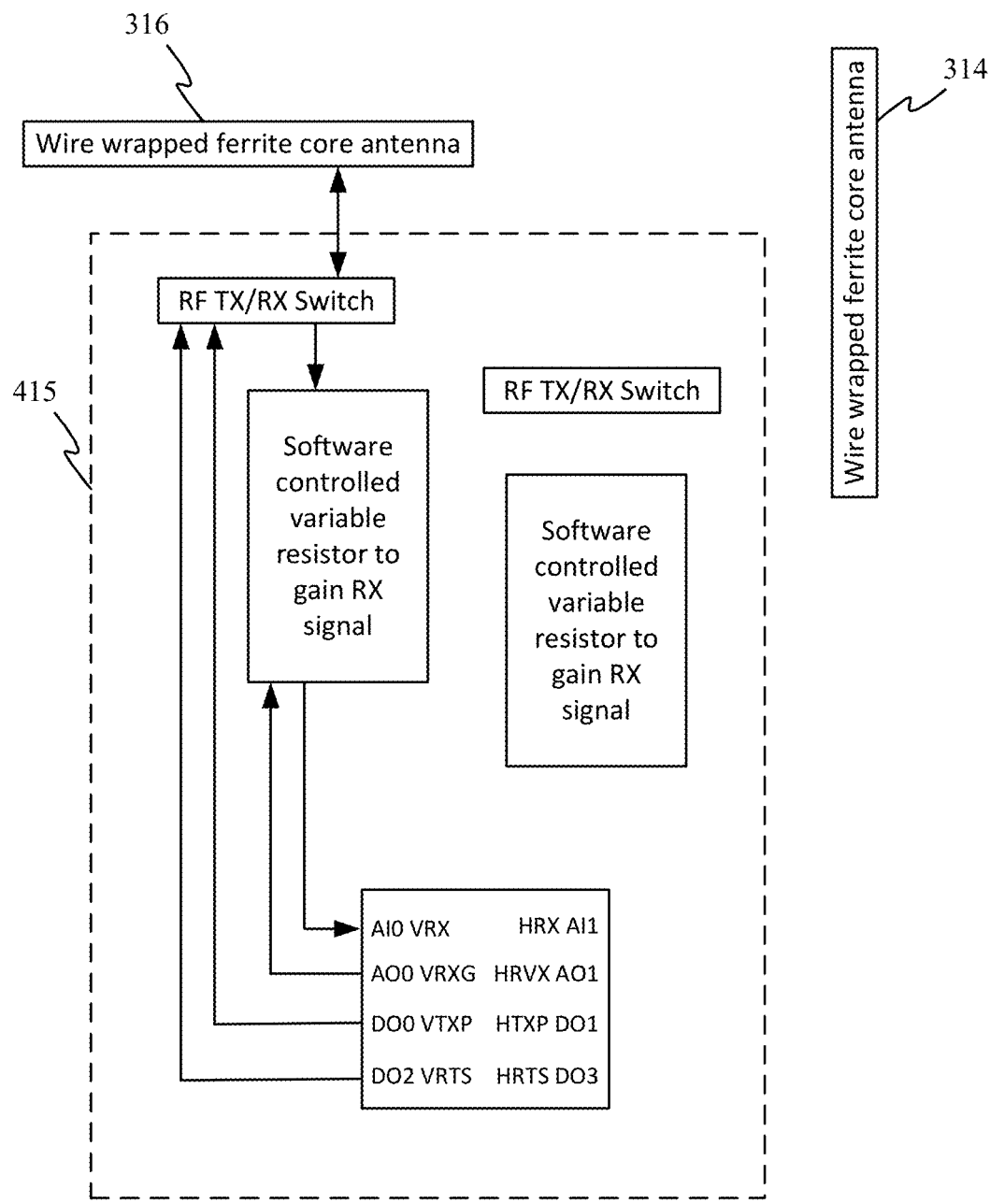
FIG. 4 illustrates a schematic depiction for circuitry associated with RF antennas of the inventive monitoring device.

The at least two RF antennas (e.g., RF antenna 314 and RF antenna 316) can be used as an electromagnetic interference sensor. The first radio frequency (RF) antenna 314 and the second RF antenna 316 are coupled to the support 310 such that each antenna extends along a corresponding antenna axis. The two RF antennas are positioned such that the first antenna axis AT1 intersects the second antenna axis AT2 orthogonally and the antennas themselves are arranged in a sideways "T" formation. The first antenna 314 may function as a transmitter and the second antenna 316 may function as a receiver (or vice-versa) with the transmission power calibrated by the manufacturer. In this case, the signal received by the second antenna 316 from the first antenna 314 can be compared (e.g., at microprocessor 311 or by other/additional circuitry such as RF Analog circuit 315) to the set transmission power of the first antenna 314 in order to determine the level of background noise in particular enclosure 10. This level of background noise may then be monitored over a variety of polarities and frequencies in order determine the presence of electrical anomalies that would be manifested as RF signals deviating from background noise levels. Additional circuitry (e.g., RF Analog circuit 315) associated with the operation of the first and second antennas 314, 316 may further be provided and coupled to the support 310. FIG. 4 illustrates an embodiment of the additional circuitry for the RF antennas.

In one implementation, power connection 319 is configured to couple to and provide power and Wi-Fi connectivity to the plurality of components coupled to the support 310. For example, Wi-Fi or other wireless network coverage can be extended to the monitoring device through Power over Ethernet (e.g., PoE Type 1, PoE Type 2 (PoE+) and subsequent variants thereof) and including on-board Wi-Fi (e.g., all variants up to and including 802.11be) or mesh, cellular, or low-power wide area technologies (e.g., long range (LoRa), fibre optic, etc.).

The monitoring device 300 may comprise a power and connectivity sensor 312 configured to detect an interruption in power and/or connectivity to the monitoring device 300.

The monitoring device 300 can also include an Ethernet terminal and isolation module 313 and a power converter 317. The monitoring device can be configured to be used in electrical systems of 440V-13.6 kV and may include additional filters and hardware in order to enable proper functioning in such high-voltage systems.

Referring to FIG. 3B, monitoring device 350, which can be used to implement monitoring device 100, includes a plurality of sensors (one of which is an electromagnetic interference sensor 359 that can include at least two RF antennas such as described with respect to FIG. 3A), at least one processor (e.g., microprocessor 361), a power connection 365 configured to receive electrical and Ethernet input (e.g., in the form of Power over Ethernet), and a support 370 configured to couple to an interior surface of the electrical enclosure (e.g., enclosure 10). The monitoring device 350 can further include a housing configured to at least partially surround the support 370 and define one or more openings. That is, a housing (not shown) at least partially surrounds the support 370 and any components coupled to the support 370.

Support 370 is configured to be mounted to a rack, rail, or other surface inside an electrical enclosure (e.g., enclosure 10). In an embodiment, the support 370 is an electrical board or circuit board configured to electrically couple components that are coupled to the board 370.

Similar to that shown in FIG. 3A, in the embodiment shown in FIG. 3B, the one or more sensors of monitoring device 350 can include a vibration sensor 318, a noise sensor and/or microphone 320, an infrared (IR) sensor 322, a photo or light sensor 324, a climate sensor 326 (e.g., configured to measure temperature, humidity, and air quality), a motion sensor 328 (which may be used as a human presence sensor), and an ozone sensor 330. As shown in FIG. 3B, connections between processor 361 and the sensors can depend on the type of sensor. For example, an I2C standard bus configuration can be used for the IR sensor 322 and the light sensor 324, an I2S standard bus configuration can be used for the noise sensor 320, an ADC input of the processor 361 can be used for the electromagnetic interference sensor 359, ozone sensor 330, and motion sensor 328, and a serial peripheral interface (SPI) input of the processor 361 can be used for the vibration sensor 318 and climate sensor 326.

As mentioned above, monitoring device 300 and monitoring device 350 include a plurality of sensors, which can be used as monitoring components configured to monitor various conditions inside the enclosure 10 and/or conditions pertaining to the electrical equipment 12 housed within the enclosure 10. The plurality of monitoring components may include one or more sensors such as but not limited to a photo sensor, a vibration sensor, an electromagnetic interference sensor, an ozone sensor, a moisture or humidity sensor, a temperature sensor, an infrared sensor, and a noise sensor. The sensors are electrically and mechanically coupled to the support 310. Each of the sensors may be electrically coupled to one or more of the other sensors or components of the monitoring device 300, 350. One or more of the components of the monitoring device 300, 350 may be configured for wireless communication with an external control device or processor (not shown) to enable remote monitoring of the enclosure 10, for example, by including an appropriate communications interface (and including or being coupled to an antenna). Additional features and components can be included to facilitate communications between one or more of the plurality of components (e.g., monitoring components and/or power and connectivity sensor 312) of the monitoring device 300, 350.

FIG. 4 illustrates a schematic depiction for circuitry associated with RF antennas of the inventive monitoring device. Referring to FIG. 4, a chip of circuitry 415 has a voltage connection for the receiver (VRX), a ground connection for the receiver (VRXG), transmitter pin VTXP and output pin VRTS. The incoming signal(s) from the antenna 114 can be amplified/boosted (e.g., via software-controlled variable gain) before being processed.

FIG. 5 illustrates a schematic layout for an ozone sensor for an embodiment of the inventive monitoring device. As schematically illustrated in FIG. 5, the ozone sensor 330 may be fluidly coupled to a moisture trap 532 formed on support 310 and configured to drain condensation or moisture in general from the ozone sensor 330, which would decrease the performance of the sensor. The moisture trap 532 generally comprises a body 531 that at least partially surrounds the ozone sensor 530, and a tube extending from a first end 534 proximate the ozone sensor 530 to a trap portion 536. At the trap portion 536, the tube bends in an "S" or "Z" shape before extending to the drain portion 538. The trap portion 536 is configured to trap an amount of liquid in the tube to preserve the ambient environment around the ozone sensor. In other words, blocking air from escaping into the drain portion 538 after moving past the ozone sensor 330 allows that air to remain around the ozone sensor 330 for a longer period of time which increases the sensitivity of the ozone sensor 330 to increased ozone levels. Increased ozone levels may be the result of an electrical anomaly such as arcing, which may foreshadow a future electrical failure within the enclosure 10. The drain portion 538 may extend outside of the enclosure 10.

Figure 6:
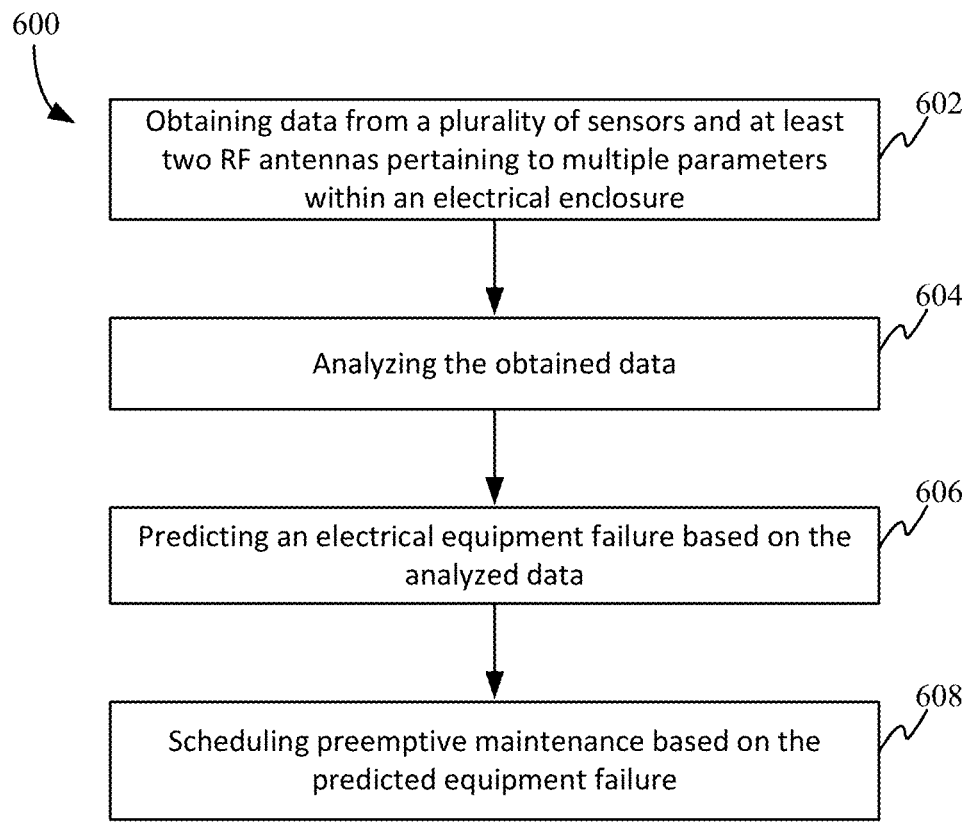
FIG. 6 illustrates a method of non-invasively monitoring multiple parameters within an electrical enclosure.

FIG. 6 illustrates a method of non-invasively monitoring multiple parameters within an electrical enclosure. Referring to FIG. 6, method 600 includes obtaining (602) data from the plurality of sensors and the at least two RF antennas of a monitoring device (e.g., as described with respect to FIGS. 3A and 3B) pertaining to multiple parameters within the electrical enclosure; analyzing (604) the obtained data; predicting (606) an electrical equipment failure based on the analyzed data; and scheduling (608) preemptive maintenance based on the predicted equipment failure. Method 600 can be stored as instructions in a memory storage (e.g., of a microprocessor or a separate hardware memory device) and performed (e.g., executed) by a processor (e.g., the microprocessor) of a monitoring device.

For example, the monitoring devices 300 and 350 shown in FIGS. 3A and 3B are configured to predict an electrical failure using multiple parameters (e.g., by performing operations 602, 604, and 606 of method 600 at processor 311/361). The processor 311/361 and/or monitoring device 300/350 can perform machine learning inference on board and/or include decision/classification logic such as threshold detection and state machine representations.

The below example is for illustrative purposes and represents how an embodiment of the monitoring device may work to predict a future electrical failure within an enclosure 10.

In this example, a corroded connection may begin to exhibit an abnormal electrical discharge in the form of arcing. The electrical arching results in increased levels of ozone around the suspect connection and perhaps within the enclosure 10. This increase in ozone concentration may then be detected by the ozone sensor 330 of the monitoring device 300/350, which may in turn send a signal corresponding to the measured ozone concentration to the processor 311/361. The processor 311/361 (executing stored instructions) analyzes the signal which may include comparing the measured ozone level to a predetermined ozone concentration range or one or more ozone concentration thresholds. If the measured ozone concentration is above the predetermined range or higher than the threshold values, then a warning may be produced to indicate a high probability of electrical failure. Concurrently, the electrical arcing may be detected by the RF antennas 314, 316 in the form of one or more RF signals received by the receiving RF antenna that deviate from background noise levels. The signals received by the receiving RF antenna may be analyzed by the processor 311/361 to determine whether such signals equate to something more than background noise, and whether such signals may be related to an electrical component within the enclosure 10 that is on the verge of failing.

In addition, a photo sensor 324 that is part of the monitoring device may detect a light emission that is associated with the electrical arcing and transmit a corresponding signal to the processor 311/361. The processor 311/361 is configured to analyze the signal(s) provided by the one or more photo sensors 324 and may be capable of determining whether the signal corresponds to light emitted from an electrical arching event or the opening of the portal to the enclosure causing environmental light to enter the enclosure 10 (e.g., based on timing and intensity values). A temperature sensor 326 that is part of the monitoring device is configured to continuously take temperature readings inside the enclosure 10 or otherwise proximate to the monitoring device 300/350. In this example, the temperature sensor is able to measure a rise in temperature that may be the result of the electrical arching. The temperature sensor 326 is configured to continuously transmit temperature data to the processor 311/361 where it is analyzed to determine whether a potential electrical failure condition exists.

While the processor 311/361 individually receives (602) and analyzes (604) data provided by the various components of the monitoring device, it is also capable of using multiple data inputs (e.g., as shown in the example above) when determining (606) the probability of a future electrical failure as well as the location of the components sending data within the enclosure in order to assist in locating the suspect electrical equipment.

If an electrical failure is predicted in operation 606, the processor 311/361 may be capable of automatically scheduling (608) maintenance for the specific enclosure. In an embodiment, one or more data readings and/or documentation of abnormal data received by the processor 311/361 may be included with the maintenance request so that the individual performing the maintenance is aware of the symptoms of the potential failure and the location.

Additional embodiments include any one of the embodiments described above and described in any and all exhibits and other materials submitted herewith, where one or more of its components, functionalities or structures is interchanged with, replaced by, or augmented by one or more of the components, functionalities or structures of a different embodiment described above.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure.

What is claimed is:

1. A monitoring device configured to monitor conditions within an electrical enclosure containing electrical equipment, the monitoring device comprising:
    a plurality of sensors, wherein the plurality of sensors comprises an ozone sensor;
    at least two RF antennas;
    at least one processor in communication with the plurality of sensors and the at least two RF antennas;
    a power connection configured to receive electrical and Ethernet input;
    a support configured to couple to an interior surface of the electrical enclosure, the support configured to hold and electrically couple the plurality of sensors, the at least two RF antennas, the at least one processor, and the power connection, wherein the ozone sensor is fluidly coupled to a moisture trap formed on the support, wherein the moisture trap comprises a body and a tube extending from a first end proximate the ozone sensor to a trap portion and a drain portion; and
    a housing configured to at least partially surround the support and define one or more openings,
    wherein the at least one processor is configured to receive and analyze data obtained from the plurality of sensors and the at least two RF antennas pertaining to a plurality of conditions inside the electrical enclosure, and wherein the at least one processor is configured to detect a potential electrical equipment failure based on the received an analyzed data.

2. The monitoring device of claim 1, wherein at least one of the plurality of sensors is a motion sensor.

3. The monitoring device of claim 1, wherein at least one of the plurality of sensors is a climate sensor configured to measure temperature, humidity, and air quality.

4. The monitoring device of claim 1, wherein the at least two RF antennas are positioned orthogonally relative to each other.

5. The monitoring device of claim 1, wherein at least one of the plurality of sensors is configured to measure a sound level.

6. The monitoring device of claim 1, wherein at least one of the plurality of sensors is a photo sensor.

7. The monitoring device of claim 1, wherein at least one of the plurality of sensors is configured to detect vibrations.

8. The monitoring device of claim 1, wherein the support comprises a circuit board.

9. The monitoring device of claim 1, wherein at least one of the plurality of sensors is configured to detect infrared radiation.

10. The monitoring device of claim 1, wherein the power connection is configured to receive the electrical and Ethernet input as Power over Ethernet.

11. A method of non-invasively monitoring multiple parameters within an electrical enclosure, the method comprising:
    providing a monitoring device comprising a plurality of sensors, wherein the plurality of sensors comprises an ozone sensor; at least two RF antennas; at least one processor in communication with the plurality of sensors and the at least two RF antennas; a power connection configured to receive electrical and Ethernet input; a support configured to couple to an interior surface of the electrical enclosure, the support configured to hold and electrically couple the plurality of sensors, the at least two RF antennas, the at least one processor, and the power connection, wherein the ozone sensor is fluidly coupled to a moisture trap formed on the support, wherein the moisture trap comprises a body and a tube extending from a first end proximate the ozone sensor to a trap portion and a drain portion; and a housing configured to at least partially surround the support and define one or more openings;
    obtaining data from the plurality of sensors and the at least two RF antennas pertaining to multiple parameters within the electrical enclosure;
    analyzing the obtained data;
    predicting an electrical equipment failure based on the analyzed data, wherein the obtained data comprises a measured ozone level, wherein analyzing the obtained data and predicting the electrical equipment failure based on the analyzed data comprises:
        comparing the measured ozone level to a predetermined ozone concentration range or one or more ozone concentration thresholds, the electrical equipment failure being predicted when the measured ozone concentration is above the predetermined range or higher than the one or more ozone concentration thresholds;
    producing a warning in response to the electrical equipment failure being predicted when the measured ozone concentration is above the predetermined range or higher than the one or more ozone concentration thresholds; and
    scheduling preemptive maintenance based on the predicted equipment failure.

12. The method of claim 11, wherein the obtained data includes temperature data.

13. The method of claim 11, wherein the obtained data includes sound data.

14. The method of claim 11, wherein the obtained data is motion data.

15. The method of claim 14, further comprising tracking access to the electrical enclosure based on the motion data.

16. The method of claim 15, wherein the tracking of access to the electrical enclosure comprises identifying personnel accessing the electrical enclosure.

17. The method of claim 14, wherein the interior surface to which the support of the monitoring device is coupled is the interior surface of an access portal of the enclosure.

18. The method of claim 11, wherein the power connection of the monitoring device receives the electrical input as Power over Ethernet or receives the Ethernet input as Ethernet over Power.

* * * * *